United States Patent
Tsuchi et al.

(10) Patent No.: US 10,964,287 B1
(45) Date of Patent: Mar. 30, 2021

(54) LEVEL VOLTAGE GENERATION CIRCUIT, DATA DRIVER, AND DISPLAY APPARATUS

(71) Applicant: LAPIS Semiconductor Co., Ltd., Yokohama (JP)

(72) Inventors: Hiroshi Tsuchi, Yokohama (JP); Manabu Nishimizu, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 17/023,381

(22) Filed: Sep. 17, 2020

(30) Foreign Application Priority Data

Sep. 24, 2019 (JP) ................................. 2019-172858

(51) Int. Cl.
*G09G 3/36* (2006.01)
*H03K 3/0233* (2006.01)

(52) U.S. Cl.
CPC ......... *G09G 3/3696* (2013.01); *G09G 3/3688* (2013.01); *H03K 3/0233* (2013.01); *G09G 2320/0233* (2013.01); *G09G 2320/0673* (2013.01)

(58) Field of Classification Search
CPC ............... G09G 3/3696; G09G 3/3688; G09G 2320/0673; G09G 2320/0233; H03K 3/0233
See application file for complete search history.

(56) References Cited

U.S. PATENT DOCUMENTS

| 2009/0303219 | A1* | 12/2009 | Kimura | G09G 3/3688 345/211 |
| 2010/0182299 | A1* | 7/2010 | Hyoudou | G09G 3/006 345/211 |
| 2011/0148953 | A1* | 6/2011 | Kudo | H03F 3/45475 345/690 |
| 2017/0011680 | A1* | 1/2017 | Miyata | G02F 1/1339 |
| 2018/0131385 | A1* | 5/2018 | Aoki | H03M 1/76 |
| 2019/0012980 | A1* | 1/2019 | Shiibayashi | H03F 3/45219 |
| 2019/0073940 | A1* | 3/2019 | Morita | H03F 3/45475 |

FOREIGN PATENT DOCUMENTS

JP    2008146028    6/2008

* cited by examiner

*Primary Examiner* — Andrew Sasinowski
(74) *Attorney, Agent, or Firm* — JCIPRNET

(57) ABSTRACT

The display apparatus includes: N differential amplifiers having output ends, amplifying N input voltages and outputting amplified voltages, and a resistor ladder having N voltage supply points connected to the output ends of the N differential amplifiers and M voltage output points outputting M level voltages. The M voltage output points are connected to capacitive loads on input sides of the amplifiers, and at least one N differential amplifier has an input pair and an output end connected to one of the N voltage supply point. One of the N input voltages is received by one of the input pair, the other one of the input pair is connected to one of the M voltage output points outputting a level voltage closest to a voltage at the one voltage supply point. The one voltage supply point and the one voltage output point are at different positions on the resistor ladder.

11 Claims, 9 Drawing Sheets

US 10,964,287 B1

LEVEL VOLTAGE GENERATION CIRCUIT, DATA DRIVER, AND DISPLAY APPARATUS

CROSS REFERENCE TO RELATED APPLICATIONS

This application claims the priority benefit of Japanese Patent Application No. 2019-172858, filed on Sep. 24, 2019. The entirety of the above-mentioned patent application is hereby incorporated by reference herein and made a part of this specification.

BACKGROUND OF THE DISCLOSURE

Technical Field

The disclosure relates to a level voltage generation circuit, a data driver, and a display apparatus.

Related Art

In recent years, active matrix drive has been employed as a drive method for a display apparatus including a display device such as a liquid crystal display or an organic electro luminescence (EL) display. In an active matrix drive type display apparatus, a display panel is configured by a semiconductor substrate (for example, in the case of a color 4K panel, 3840×RGB pixel columns×2160 pixel rows) in which pixel portions and pixel switches are disposed in a matrix. The on/off of the pixel switches is controlled according to gate signals, and when the pixel switches are turned on, gradation voltage signals corresponding to video data signals are supplied to the pixel portions to control the brightness of each pixel portion, thereby performing display. The supply of the gate signals to the pixel switches is performed by a gate driver via scanning lines. In addition, the supply of the gradation voltage signals to the pixel portions is performed by a data driver via data lines. The gate driver supplies at least binary gate signals while the data driver supplies multilevel gradation voltage signals corresponding to gradation voltages.

In the active matrix drive type display apparatus, there is a demand for higher precision of the gradation voltage (hereinafter also referred to as output voltage) output from the data driver due to needs for multi-gradation, higher definition, and higher image quality. Particularly, in a display panel using a plurality of data driver integrated circuits (IC) as the data driver, the variation in output voltages among the data driver ICs causes display unevenness. The variation in output voltages among the data driver ICs is required to be, for example, 5 mV or less. The variation in output voltages among the data driver ICs is mainly caused by voltage precision of a level voltage generation circuit in each data driver IC.

The level voltage generation circuit is built in the data driver IC and included in a gamma voltage/gradation voltage generation circuit. The gamma voltage/gradation voltage generation circuit includes a level voltage generation circuit that generates a plurality of gamma voltages from a gamma reference voltage and a level voltage generation circuit that generates voltages corresponding to the gradation voltages from the plurality of gamma voltages. Gradation voltage signals generated by the gamma voltage/gradation voltage generation circuit are supplied to a digital/analog (D/A) conversion portion. The D/A conversion portion is configured by a plurality of decoders and output amplifiers arranged for each output of the data driver ICs. The plurality of level voltages generated by the gamma voltage/gradation voltage generation circuit is commonly supplied to each of the plurality of decoders. Each decoder selects one or a predetermined number of level voltages from the plurality of level voltages according to video digital signals input from the outside of the data driver ICs, and supplies the selected level voltage to the corresponding output amplifier. Each output amplifier outputs a gradation voltage signal obtained by arithmetically amplifying the level voltage selected by the decoder.

The gamma voltage/gradation voltage generation circuit is equipped with, for example, a pair of amplifiers that respectively receive the supply of the gamma reference voltage, and each of the pair of amplifiers current-amplifies the gamma reference voltage and supplies the amplified voltage to both ends of a first resistor ladder. Plural levels of gamma voltages obtained by dividing the gamma reference voltages are output from the first resistor ladder. The plurality gamma decoders select some gamma voltages from the output voltages of the first resistor ladder based on a gamma adjustment digital signal input externally and supply the selected gamma voltages to the plurality of amplifiers. The plurality of amplifiers current-amplify the gamma voltages selected by the gamma decoders respectively and supply the amplified voltages to a second resistor ladder. From the second resistor ladder, a plurality of level voltages obtained by dividing the gamma voltages are output as voltages corresponding to the gradation voltages.

FIG. 11A is a plan view schematically showing an example of a supply part of the gamma voltage/gradation voltage generation circuit that supplies the gamma reference voltage or the gamma voltage to the first resistor ladder or the second resistor ladder. Besides, only one end side of the resistor ladder is shown here. In addition, FIG. 11B is a cross-sectional view taken along line A-A of FIG. 11A.

The resistor ladder is configured by a resistor layer 52, a plurality of metal wirings, and contacts (in FIG. 11A, metal wirings m0, m1 and m2, contacts cn0, cn1 and cn2). The resistor layer 52 is configured by forming a thin film on a substrate such as a semiconductor substrate or an insulating substrate. The metal wiring m0 is connected to the resistor layer 52 via the contact cn0. The metal wiring m1 is connected to the resistor layer 52 via the contact cn1. The metal wiring m2 is connected to the resistor layer 52 via the contact cn2.

The resistor layer 52, the metal wirings m0, m1 and m2, and the contacts cn0, cn1 and cn2 are laid out in the resistor ladder so that the voltage corresponding to a voltage design value is taken out with a dimension based on a pre-created resistor design value and a sheet resistance of the resistor layer 52. For example, when voltage design values on the resistor layer 52 obtained by dividing the voltage according to resistor design values R0 and R1 are set as Vgs0, Vgs1 and Vgs2, it is expected that the voltages Vgs0, Vgs1 and Vgs2 are takedatan out from the metal wirings m0, m1 and m2 by setting the contacts cn0, cn1 and cn2 at the voltage division points on the resistor layer 52.

The amplifier 51 receives, for example, the supply of a gamma reference voltage VG0 at the non-inversion input end, and outputs an output voltage Vout obtained by current-amplifying the gamma reference voltage VG0. The output voltage Vout output from the amplifier 51 is applied to the inversion input end of the amplifier 51 and is supplied to a boundary (voltage supply point) of the region of a resistor R0 of the resistor layer 52 via the metal wiring m0 and the contact cn0. In addition, the output voltages (that is, the divided voltages) of the resistor ladder are taken out from the metal wirings m0, m1 and m2. Besides, when a case in which the non-inversion input end and the inversion input end of the amplifier 51 have the same voltage is set as a stable state, the output voltage Vout of the amplifier 51 is equal to the gamma reference voltage VG0 in the stable state.

The boundary point of the region of the resistor R0 of the resistor layer 52 to which the contact cn0 is connected becomes a voltage supply point and a voltage output point on the resistor layer 52. The output voltage Vout (=VG0) of the amplifier 51 is supplied to the metal wiring m0, and the voltage VG0 is taken out from the metal wiring m0.

The amplifier 51 is arranged near one end of the resistor ladder and supplies a voltage obtained by current-amplifying the gamma reference voltage VG0 to the metal wiring m0 as the output voltage Vout (=VG0). Near the other end of the resistor ladder, an amplifier (not shown) that outputs a gamma voltage is arranged at, for example, a position forming a pair with the amplifier 51. A current corresponding to the voltage difference between the gamma voltage and the gamma reference voltage VG0 supplied from the amplifier 51 flows through the resistor layer 52. In addition, the current also flows through the metal wiring m0 and the contact cn0. Here, when the resistance value of the metal wiring m0 is sufficiently small and can be ignored, a voltage difference Vc corresponding to a resistor Rc of the contact cn0 is generated between the gamma reference voltage VG0 applied to the metal wiring m0 and the voltage Vgs0 at the voltage supply point and the voltage output point on the resistor layer 52. That is, the relationship between the voltage VG0 of the metal wiring m0 and the voltage Vgs0 on the resistor layer 52 becomes VG0=Vgs0+Vc.

On the other hand, the metal wirings m1 and m2 which are the voltage output ends of the resistor ladder are connected to a gate part of the amplifier forming an output portion of the gradation voltage signal. Therefore, no steady current flows through the metal wirings m1 and m2 and the contacts cn1 and cn2. Accordingly, the voltages Vgs1 and Vgs2 on the resistor layer 52 are directly taken out from the metal wirings m1 and m2.

The resistance value between the metal wiring m0 and the metal wiring m1 is not the resistance value R0 which is the design resistor value, but a resistance value obtained by adding the resistance Rc of the contact cn0 to the resistance value R0. Therefore, a relative error among voltages is generated in the divided voltages output from the resistor ladder.

In order to eliminate the relative error among the divided voltages, a multilevel voltage generator is proposed which has a configuration in which the voltage supply point for receiving the supply of the output voltage Vout from the amplifier 51 and the voltage output point for outputting the voltage Vgs0 are separated on the resistor layer 52 (for example, patent literature 1 (Japanese Patent Application Laid-Open No. 2008-146028)).

In this multilevel voltage generator, for example, the region of a resistor Rr is arranged closer to the outer side (that is, the end side of the resistor ladder) than the region of the resistor R0 of the resistor layer 52, and a metal wiring m0a is connected to the outermost part of the region of the resistor Rr via a contact cn0a. Besides, the output voltage Vout of the amplifier 51 is supplied to the resistor layer 52 via the metal wiring m0, and the output voltage of the resistor ladder is taken out from the metal wiring m0a. At this time, no steady current flows through the resistor layer 52, and thus the voltage is equal at the voltage supply point of the resistor layer 52 to which the contact cn0 is connected and at the voltage output point of the resistor layer 52 to which the contact cn0a is connected, and becomes the voltage Vgs0. According to this configuration, the voltage corresponding to a voltage division ratio of the resistor design values R0 and R1 can be output from the metal wiring m0a of the resistor ladder, and thus the relative error of the divided voltages can be improved.

According to the multilevel voltage generator as in the above literature of related art, it is possible to improve the relative error among voltages of the divided voltages output from the resistor ladder, but there is still a difference of the voltage Vc corresponding to the resistor Rc of the contact cn0 between the output voltage Vgs0 output from the metal wiring m0a and the gamma reference voltage VG0 which is an expected output value. That is, an absolute error is generated between the output voltage from the resistor ladder and the expected value of the output voltage. In addition, the resistance values of the contacts generally have a larger variation than the resistance values of the resistor layer.

Then, when a variation is generated in the resistance values of the contacts connecting the resistor layer and the metal wirings among different data driver ICs, an error is generated in the level voltages generated inside the data driver. Therefore, an error is also generated in the gradation voltage signals output from the data driver, which causes display unevenness.

The disclosure provides a display apparatus capable of suppressing variation in output voltages among data driver ICs and performing uniform display.

SUMMARY

A level voltage generation circuit according to the disclosure generates, based on N (N is an integer greater than or equal to 2) different input voltages, M (M is an integer greater than N) level voltages. The level voltage generation circuit includes: N differential amplifiers having output ends, which receive the N input voltages respectively, amplify the N input voltages respectively and output amplified N input voltages; and a resistor ladder having N voltage supply points respectively connected to the output ends of the N differential amplifiers and M voltage output points for outputting the M level voltages. The M voltage output points are connected to capacitive loads on input sides of the load amplifiers, and at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

In addition, a data driver according to the disclosure is connected to a display panel having a plurality of data lines and supplies gradation voltage signals corresponding to video data signals to the plurality of data lines. The data driver includes: a gamma voltage generation circuit that amplifies N (N is an integer greater than or equal to 2) different reference voltages supplied to the data driver and generate M (M is an integer greater than N) gamma voltages obtained by dividing the amplified N reference voltages; and a gradation voltage output portion that generates the gradation voltage signals according to the video data signals based on the M gamma voltages output from the gamma voltage generation circuit. The gamma voltage generation circuit includes: N differential amplifiers having output ends, which receive the N reference voltages, amplify the N reference voltages respectively and output the amplified the N reference voltages; and a resistor ladder having N voltage supply points respectively connected to the output ends of the N differential amplifiers and M voltage output points for outputting the M gamma voltages; the M voltage output points are connected to capacitive loads on input sides of the amplifiers having the gradation voltage output portion, and at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

In addition, a data driver according to the disclosure is connected to a display panel having a plurality of data lines and supplies gradation voltage signals corresponding to video data signals to the plurality of data lines. The data driver includes: a gamma voltage generation portion that generates N (N is an integer greater than or equal to 2) different gamma voltages, and a gradation voltage generation circuit that amplify the N gamma voltages and generates, M (M is an integer greater than N) gradation voltages obtained by dividing the amplified N gamma voltages, and outputs the gradation voltages corresponding to the video data signals to an amplifier arranged for each output of the data driver. The gradation voltage generation circuit includes: N differential amplifiers having output ends, which receive the N gamma voltages respectively, amplify the N gamma voltages respectively and output the amplified N gamma voltages; and a resistor ladder having N voltage supply points respectively connected to the output ends of the N differential amplifiers and M voltage output points for outputting the M gradation voltages; the M voltage output points are connected to capacitive loads on input sides of the amplifiers having the gradation voltage output portion, and at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

In addition, a display apparatus according to the disclosure includes: a display panel having a plurality of data lines, a plurality of scanning lines, and pixel switches and pixel portions arranged at respective intersection portions of the plurality of data lines and the plurality of scanning lines; a gate driver that supplies scanning signals for controlling the pixel switches to be turned on to the plurality of scanning lines in a selection duration corresponding to a pulse width; and a data driver that supplies gradation voltage signals corresponding to video data signals to the plurality of data lines. The data driver includes: a gamma voltage generation circuit that amplify N (N is an integer greater than or equal to 2) different reference voltages supplied to the data driver and generates M (M is an integer greater than N) gamma voltages obtained by dividing the amplified N reference voltages; and a gradation voltage output portion that generates the gradation voltage signals corresponding to the video data signals based on the M gamma voltages output from the gamma voltage generation circuit. The gamma voltage generation circuit includes: N differential amplifiers having output ends, which receive the N reference voltages respectively, amplify the N reference voltages respectively and output the amplified N reference voltages; and a resistor ladder having N voltage supply points respectively connected to the output ends of the N differential amplifiers and M voltage output points for outputting the M gamma voltages; the M voltage output points are connected to capacitive loads on input sides of the amplifiers having the gradation voltage output portion, and at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

In addition, a display apparatus according to the disclosure includes: a display panel having a plurality of data lines, a plurality of scanning lines, and pixel switches and pixel portions arranged at respective intersection portions of the plurality of data lines and the plurality of scanning lines; a gate driver that supplies scanning signals for controlling the pixel switches to be turned on to the plurality of scanning lines in a selection duration corresponding to a pulse width; and a data driver that supplies gradation voltage signals corresponding to video data signals to the plurality of data lines. The data driver includes: a gamma voltage generation portion that generates N (N is an integer greater than or equal to 2) different gamma voltages, and a gradation voltage generation circuit that amplifies the N gamma voltages, generates M (M is an integer greater than N) gradation voltages obtained by dividing the amplified N gamma voltages, and outputs the gradation voltage according to the video data signals to an amplifier arranged for each output of the data driver. The gradation voltage generation circuit includes: N differential amplifiers having output ends, which receive the N gamma voltages respectively, amplify the N gamma voltages respectively and output the amplified N gamma voltages, and a resistor ladder having N voltage supply points respectively connected to the output ends of the N differential amplifiers and M voltage output points for outputting the M gradation voltages; the M voltage output points are connected to capacitive loads on input sides of the amplifiers, and at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

According to the level voltage generation circuit of the disclosure, it is possible to suppress variation in output voltages among data driver ICs and perform uniform display.

DESCRIPTION OF THE EMBODIMENTS

Hereinafter, examples of the disclosure are described in detail. Besides, in the following description of each example and the accompanying drawings, parts that are substantially the same or equivalent are denoted by the same reference signs.

Embodiment 1

Figure 1:
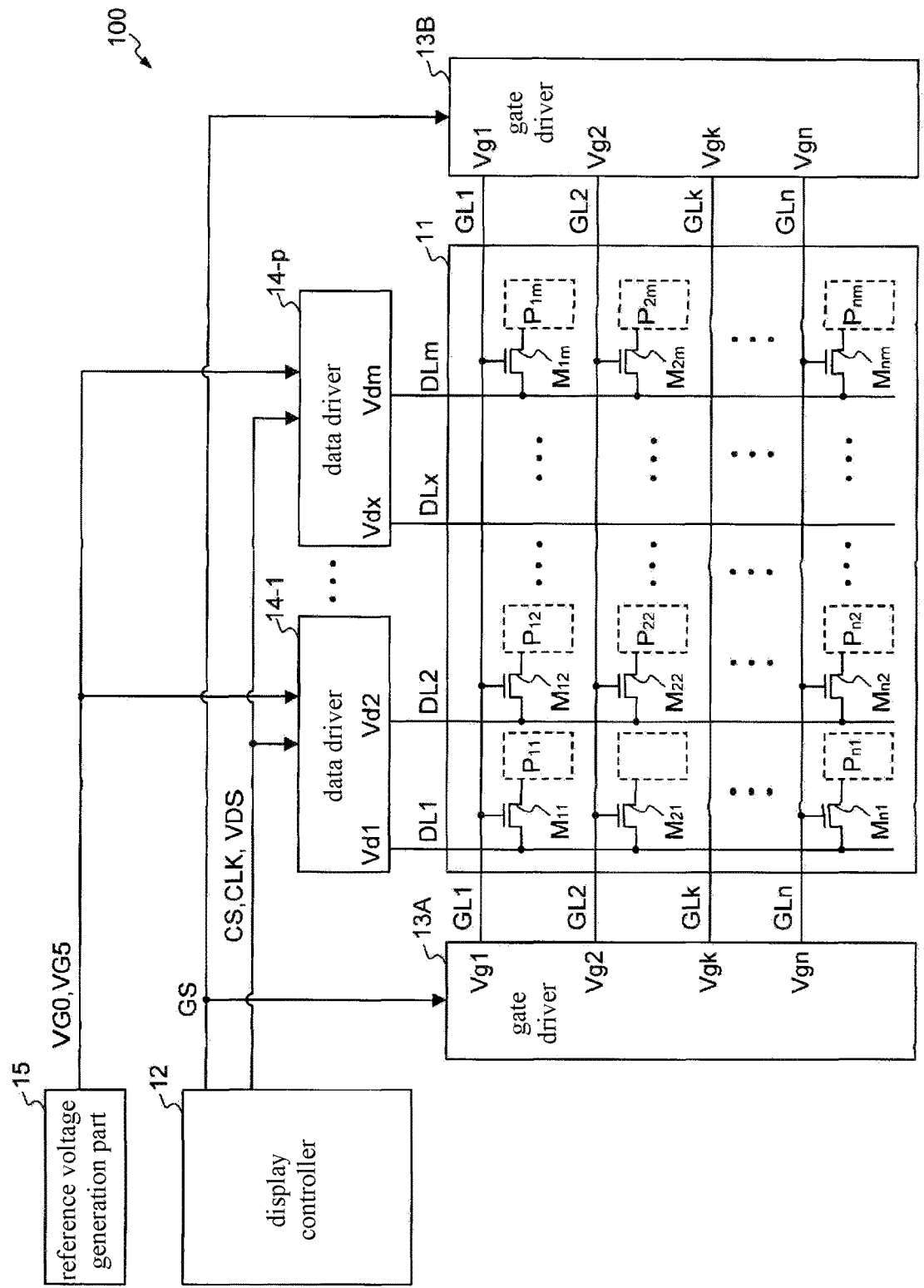
FIG. 1 is a block diagram showing the configuration of a display apparatus according to the disclosure.

FIG. 1 is a block diagram showing the configuration of a display apparatus 100 according to the disclosure. The display apparatus 100 is a liquid crystal display apparatus of an active matrix drive type. The display apparatus 100 includes a display panel 11, a display controller 12, gate drivers 13A and 13B, data drivers 14-1 to 14-$p$, and a reference voltage generation portion 15. Besides, a plurality of power supply voltages required for each block is supplied from a power supply IC to each block, but the description is omitted to avoid complication of the drawing.

The display panel 11 is configured by a semiconductor substrate in which a plurality of pixel portions $P_{11}$ to $P_{nm}$ and pixel switches $M_{11}$ to $M_{nm}$ (n, m: natural numbers of 2 or more) are disposed in a matrix. The display panel 11 has n gate lines GL1 to GLn and m data lines DL1 to DLm arranged to intersect with the gate lines GL1 to GLn. The pixel portions $P_{11}$ to $P_{nm}$ and the pixel switches Mu to Mm, are arranged at intersection portions of the gate lines GL1 to GLn and the data lines DL1 to DLm.

The pixel switches $M_{11}$ to $M_{nm}$ are controlled to be turned on or off according to gate signals Vg1 to Vgn supplied from the gate drivers 13A and 13B. The pixel portions $P_{11}$ to $P_{nm}$ receive the supply of gradation voltage signals Vd1 to Vdm corresponding to video data from the data drivers 14-1 to 14-$p$. When the pixel switches $M_{11}$ to $M_{nm}$ are respectively turned on, the gradation voltage signals Vd1 to Vdm are supplied to pixel electrodes of the pixel portions $P_{11}$ to $P_{nm}$, and the pixel electrodes are charged. The brightness of the pixel portions $P_{11}$ to $P_{nm}$ is controlled according to the gradation voltage signals Vd1 to Vdm at the pixel electrodes of the pixel portions $P_{11}$ to $P_{nm}$ and display is performed.

When the display apparatus 100 is a liquid crystal display apparatus, each of the pixel portions $P_{11}$ to $P_{nm}$ includes a transparent electrode connected to the data line via the pixel switch, and liquid crystal enclosed between the semiconductor substrate and a counter substrate which is arranged facing the semiconductor substrate and in which one transparent electrode is formed on the entire surface. With respect to backlights inside the display apparatus, the transmittance of the liquid crystal changes according to a voltage difference between the gradation voltage signals Vd1 to Vdm supplied to the pixel portions $P_{11}$ to $P_{nm}$ and the voltage of the counter substrate, and thereby the display is performed.

The display controller 12 generates a clock signal CLK having a constant clock pulse cycle (hereinafter referred to as a clock cycle). Then, the display controller 12 supplies video data signals VDS to the data drivers 14-1 to 14-$p$ according to a clock timing of the clock signal CLK. The video data signals VDS are configured as video data signals serialized according to the number of transmission paths for each of a predetermined number of data lines.

In addition, the display controller 12 adds a control signal CS including various settings to the video data signals VDS. The clock signal CLK is formed by, for example, an embedded clock method, and is supplied to each of the data drivers 14-1 to 14-$p$ as a serial signal in which the video data signal VDS, the control signal CS, and the clock signal CLK are integrated, and display control of each video data VD is performed.

In addition, the display controller 12 supplies a gate timing signal GS to the gate drivers 13A and 13B arranged at both ends of the display panel 11.

The gate drivers 13A and 13B supply the gate signals Vg1 to Vgn to the gate lines GL1 to GLn based on the gate timing signal GS supplied from the display controller 12.

The data drivers 14-1 to 14-$p$ are arranged for each of the predetermined number of data lines obtained by dividing the data lines DL1 to DLm. Each of the data drivers 14-1 to 14-$p$ is formed on a semiconductor integrated circuit (IC) chip. For example, when each data driver has 960 outputs and the display panel has one data line per pixel column, the data lines are driven by 12 data drivers in a 4K panel and driven by 24 data drivers in an 8K panel. The data drivers 14-1 to 14-$p$ receive the supply of the serial signals, in which the control signal CS, the clock signal CLK, and the video data signal VDS are integrated, through separate transmission paths from the display controller 12. When a pair (two) of transmission paths exist between the display controller 12 and each data driver, the video data VD and the control signal CS corresponding to the output number of the data driver are supplied as serialized differential signals in one data duration.

The reference voltage generation portion 15 generates gamma reference voltages VG0 and VG5 and supplies the gamma reference voltages VG0 and VG5 to the data drivers 14-1 to 14-$p$.

Figure 2:
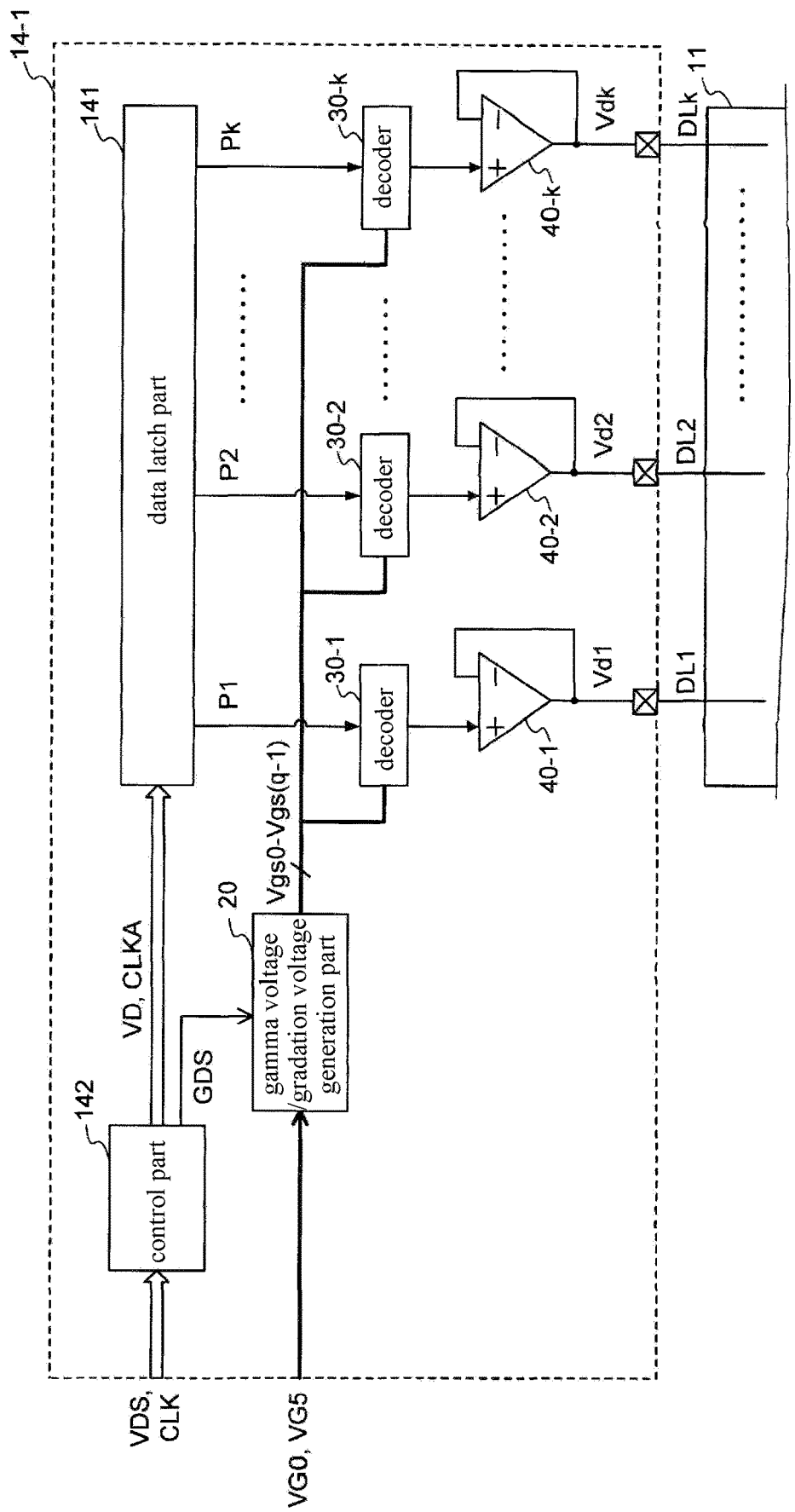
FIG. 2 is a block diagram showing the internal configuration of a data driver according to the disclosure.

FIG. 2 is a block diagram showing the internal configuration of the data driver 14-1. Besides, the other data drivers 14-2 to 14-$p$ also have the same configuration.

The data driver 14-1 includes a data latch portion 141, a control portion 142, a gamma voltage/gradation voltage generation portion 20, decoders 30-1 to 30-$k$, and output amplifiers 40-1 to 40-$k$.

The control portion 142 receives a serial signal transmitted from the display controller 12, deserializes the serial signal, and takes out the control signal CS, the clock signal CLK, and the video data signal VDS. Then, the control portion 142 outputs the video data signal VDS and a latch clock signal CLKA to the data latch portion 141 based on the control signal CS. In addition, the control portion 142 supplies, to the gamma voltage/gradation voltage generation portion 20, a gamma adjustment digital signal GDS that specifies a voltage (hereinafter, referred to as a gamma voltage) according to an inverse gamma characteristic of the display panel 11.

The data latch portion 141 sequentially takes in the series of pixel data PD included in the video data signal VDS transmitted from the control portion 142. At this time, each time k pieces of pixel data PD corresponding to the gradation voltage signal to be supplied to the data driver 14-1 among (n pieces of) pixel data PD for one horizontal scanning line are taken in, the data latch portion 141 respectively supplies the k pieces of pixel data PD to the decoders 30-1 to 30-k as pixel data P1 to Pk at a timing synchronized with the latch clock signal CLKA.

The gamma voltage/gradation voltage generation portion 20 generates a gamma voltage according to the inverse gamma characteristic of the display panel 11 based on the gamma reference voltages VG0 and VG5 that are input and the gamma adjustment digital signal GDS output from the control portion 142, further generates gradation voltages Vgs0 to Vgs(q−1) representing the brightness level that can be displayed by the display panel 11 in q gradations (for example, 256 gradations), and supplies the gradation voltages Vgs0 to Vgs(q−1) to each of the decoders 30-1 to 30-k.

Each of the decoders 30-1 to 30-k selects, from the gradation voltages Vgs0 to Vgs(q−1), at least one gradation voltage corresponding to the brightness level indicated by the pixel data PD received by itself, and supplies the selected gradation voltage to the output amplifiers 40-1 to 40-k.

Each of the output amplifiers 40-1 to 40-k is, for example, a voltage follower circuit including a so-called operational amplifier in which an output terminal thereof is connected to an inversion input terminal (−) thereof.

Each of the output amplifiers 40-1 to 40-k receive each gradation voltage output from the decoders 30-1 to 30-k at the non-inversion input terminal (+) thereof, and amplifies and outputs a voltage corresponding to the received gradation voltage to the output terminal, and thereby generates data signals Vd1 to Vdk corresponding to the respective gradation voltages. The data signals Vd1 to Vdk are supplied as pixel drive signals to the data lines DL1 to DLk of the display panel 11.

Figure 3:
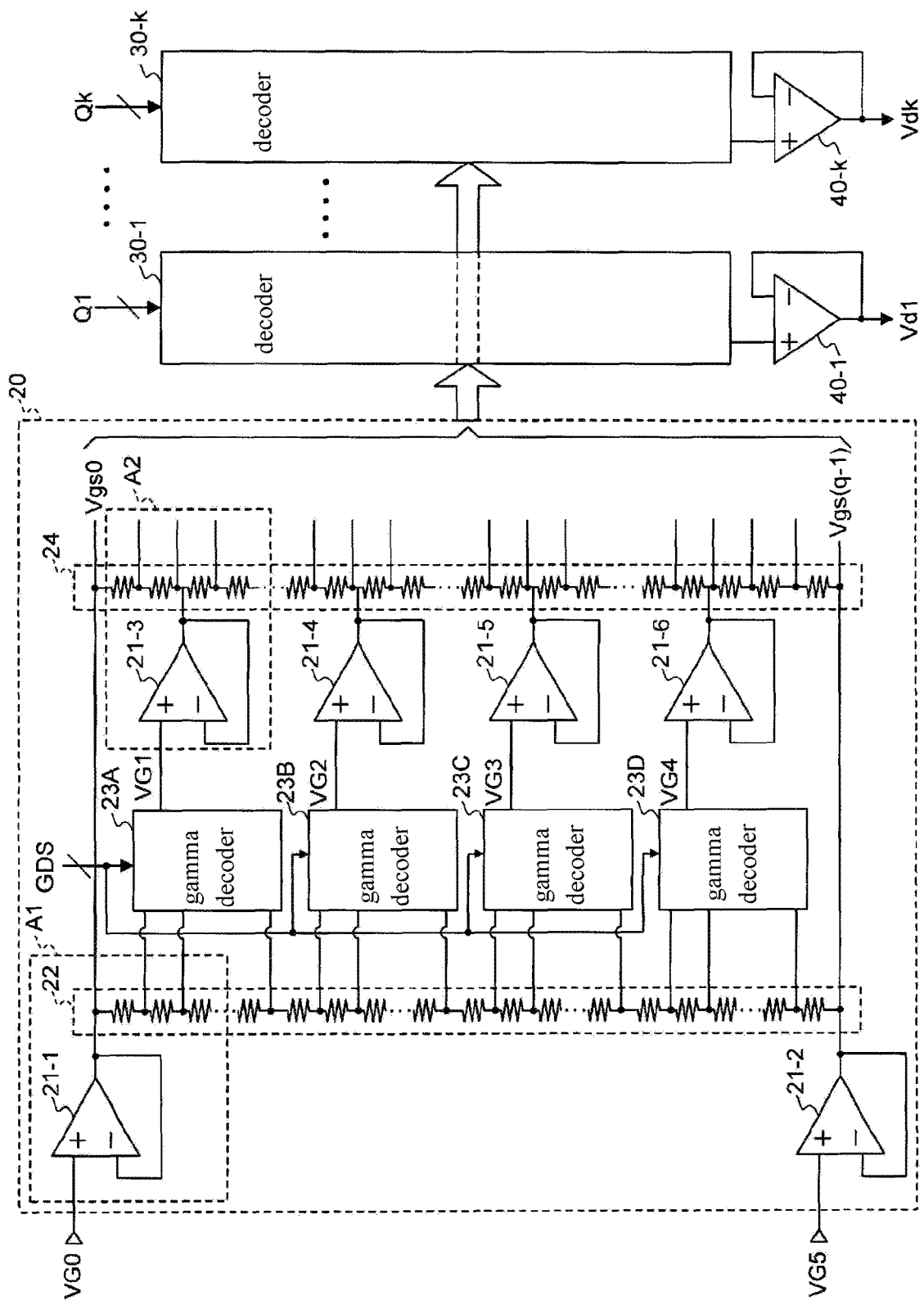
FIG. 3 is a block diagram showing the configuration of a gradation voltage generation portion according to the disclosure.

FIG. 3 is a circuit diagram showing an example of the internal configuration of the gamma voltage/gradation voltage generation portion 20. The gamma voltage/gradation voltage generation portion 20 includes gamma amplifiers 21-1 to 21-6, a first resistor ladder 22, gamma decoders 23A to 23D, and a second resistor ladder 24.

The gamma amplifier 21-1 current-amplifies the gamma reference voltage VG0 supplied from the outside and supplies the amplified voltage to one end of the first resistor ladder 22. The gamma amplifier 21-2 current-amplifies the gamma reference voltage VG5 supplied from the reference voltage generation portion 15 and supplies the amplified voltage to the other end of the first resistor ladder 22.

The first resistor ladder 22 has voltage output ends arranged at a plurality of different positions, and generates plural levels of output voltages which are obtained by, for example, linearly dividing voltages between the gamma reference voltages VG0 and VG5 and which have voltage values different from each other.

The gamma decoders 23A, 23B, 23C and 23D receive the input of the gamma adjustment digital signal GDS, select gamma voltages VG1 to VG4 from the plural levels of output voltages of the first resistor ladder 22 based on the gamma adjustment digital signal GDS, and supply the selected gamma voltages VG1 to VG4 to the input ends of the gamma amplifiers 21-3 to 21-6.

The gamma amplifiers 21-3 to 21-6 current-amplify the gamma voltages VG1 to VG4 and supply the amplified voltages to the second resistor ladder 24.

The second resistor ladder 24 generates plural levels of output voltages, which are obtained by dividing voltages among the gamma reference voltage VG0, the gamma voltages VG1 to VG4, and the gamma reference voltage VG5 and which have voltage values different from each other, and outputs the plural levels of output voltages as the gradation voltages Vgs0 to Vgs(q−1). The second resistor ladder 24 has voltage output ends arranged at a plurality of different positions, and the resistance values between the voltage output ends are designed according to the inverse gamma characteristic of the display panel 11. The gradation voltages Vgs0 to Vgs(q−1) output from the gamma voltage/gradation voltage generation portion 20 are supplied to the decoders 30-1 to 30-k arranged for each output of the data driver. The decoders 30-1 to 30-k select one or a plurality of voltages from the gradation voltages based on digital signals Q1 to Qk, and supply the selected voltages to the input ends of the output amplifiers 40-1 to 40-k.

That is, the output of the first resistor ladder 22 is supplied to the input ends of the gamma amplifiers 21-3 to 21-6 via the gamma decoders, and the output of the second resistor ladder 24 is output to the input ends of the output amplifiers 40-1 to 40-k via the decoders. Here, because the input ends of the amplifiers are capacitive loads, no steady current flows from the outputs of the first and second resistor ladders to the capacitive loads.

Level voltage generation circuits that generate plural levels of gamma voltages are formed at connection parts between each of the gamma amplifiers 21-1 and 21-2 and the first resistor ladder 22. In FIG. 3, out of the level voltage generation circuits, a circuit block located at the connection part between one end of the first resistor ladder 22 and the gamma amplifier 21-1 is shown as a level voltage generation circuit A1. Besides, a similar circuit block is also formed at the connection part between the other end of the first resistor ladder 22 and the gamma amplifier 21-2.

The level voltage generation circuit A1 includes the gamma amplifier 21-1 and a part of the first resistor ladder 22, and functions as a gamma voltage supply portion that supplies the voltage obtained by dividing the gamma reference voltages VG0 and VG5 (that is, the output voltage of the first resistor ladder 22) to the gamma decoder 23A.

Figure 4A:
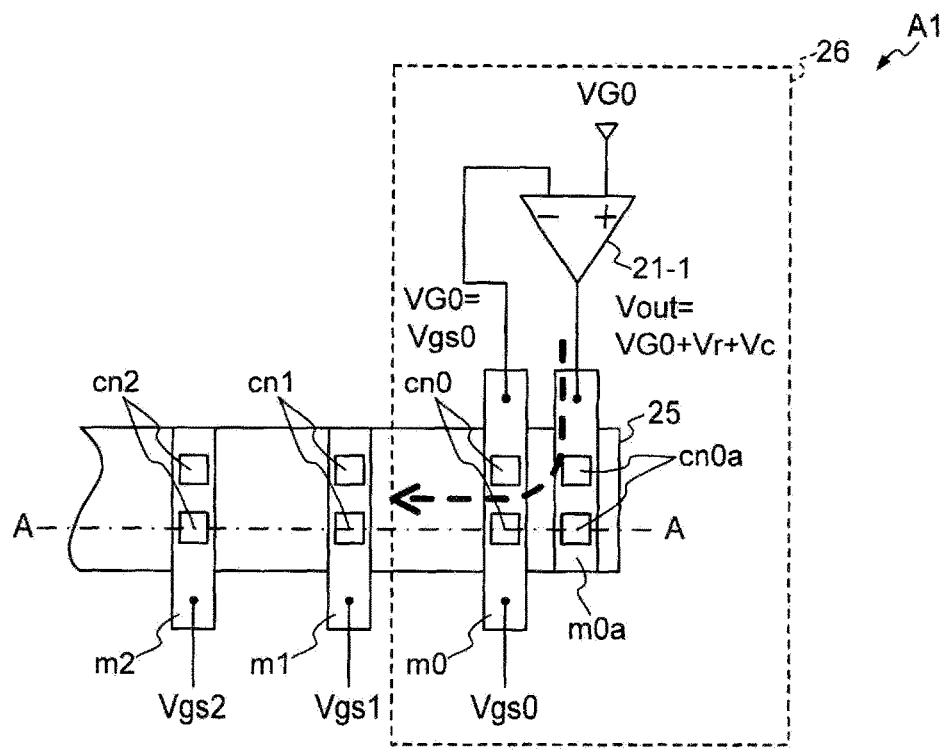
FIG. 4A is a plan view schematically showing the configuration of a level voltage generation circuit of Embodiment 1.

FIG. 4A is a schematic diagram showing the configuration of the level voltage generation circuit A1. The first resistor ladder 22 is formed using a thin film on a substrate (not shown) such as a semiconductor substrate or an insulating substrate. Here, a plan view in which a part of the resistor layer 25 constituting the first resistor ladder 22 is viewed from above is shown together with the circuit diagram of the gamma amplifier 21-1.

The level voltage generation circuit A1 is configured by the resistor layer 25 formed using a thin film on a substrate not shown, metal wirings m0a, m0, m1 and m2 including metal layers, and contacts cn0a, cn0, cn1 and cn2. An insulating layer is formed between the resistor layer 25 and the metal layers. The metal wiring m0a is connected to the resistor layer 25 via the contact cn0a which penetrates the insulating layer. The metal wiring m0 is connected to the resistor layer 25 via the contact cn0. The metal wiring m1 is connected to the resistor layer 25 via the contact cn1. The metal wiring m2 is connected to the resistor layer 25 via the contact cn2.

The metal wiring m0a is arranged at a position closer to the end of the resistor layer 25 than the other metal wirings (that is, the position closest to the end). The metal wiring m0 is a metal wiring arranged at a position close to the end of the resistor layer 25 next to the metal wiring m0a (that is, the second position when viewed from the end of the resistor layer 25). The metal wiring m1 is a metal wiring arranged at a position close to the end of the resistor layer 25 next to the metal wiring m0 (that is, the third position when viewed from the end of the resistor layer 25). The metal wiring m2 is a metal wiring arranged at a position close to the end of the resistor layer 25 next to the metal wiring m1 (that is, the fourth position when viewed from the end of the resistor layer 25).

Figure 4B:
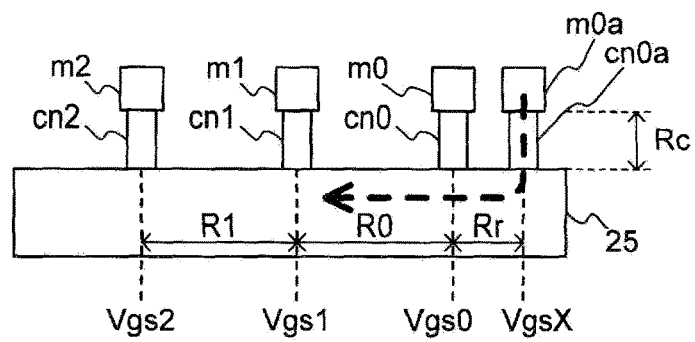
FIG. 4B is a cross-sectional view taken along line A-A of the level voltage generation circuit in FIG. 4A.

FIG. 4B is a cross-sectional view taken along line A-A of FIG. 4A. The contacts cn0a, cn0, cn1 and cn2 on the resistor layer 25 are set to divide the resistor layer 25 into resistor regions Rr, R0 and R1, and the voltages at the boundaries of the resistor regions are set as VgsX, Vgs0, Vgs1 and Vgs2. Besides, the description of the circuit diagram of the gamma amplifier 21-1 is omitted in FIG. 4B.

In FIG. 4A, one end of the metal wiring m0a is connected to the voltage output end of the gamma amplifier 21-1. One end of the metal wiring m0 is connected to the inversion input end of the gamma amplifier 21-1. In addition, the gamma reference voltage VG0 is input to the non-inversion input end of the gamma amplifier 21-1.

The dashed arrows in the diagrams of FIGS. 4A and 4B schematically indicate a direction of the current flowing from the gamma amplifier 21-1 to the resistor layer 25. Besides, the part of the first resistor ladder 22 other than the conductive portion is covered with an insulating layer.

The boundary point of the resistor region to which the contact cn0a on the resistor layer 25 is connected is a voltage supply point of the resistor layer 25, and an output voltage Vout of the gamma amplifier 21-1 is applied via the metal wiring m0a and the contact cn0a.

Each of the boundary points of the resistor regions to which the contacts cn0, cn1 and cn2 on the resistor layer 25 are connected is a voltage output point at which the voltages obtained by dividing the gamma reference voltages VG0 and VG5 by the first resistor ladder 22 are output.

The voltage Vgs0, which is the output voltage of the first resistor ladder 22, is taken out from the voltage output point of the resistor layer 25 to which the contact cn0 is connected, and the voltage Vgs0 is output via the contact cn0 and the metal wiring m0. That is, in the level voltage generation circuit A1 of this embodiment, the voltage supply point and the voltage output point are separated.

The positional relationship between the resistor layer 25 and the metal wirings m0a, m0, m1 and m2 is laid out based on a resistor design value of the first resistor ladder 22 and a sheet resistance of the resistance layer 25. For example, in FIG. 4B, a constant current flows through the resistances Rr, R0 and R1, and thus the voltages VgsX, Vgs0, Vgs1 and Vgs2 on the resistor layer 25 become voltages obtained by voltage division performed using the resistor design values Rr, R0 and R1. In addition, because each metal wiring connected to each voltage output point on the resistor layer 25 does not have a steady current flowing therein from the resistor layer 25, the voltage at each voltage output point can be directly taken out regardless of the contact resistance.

That is, the voltage Vgs0 is output from the metal wiring m0, the voltage Vgs1 is output from the metal wiring m1, and the voltage Vgs2 is output from the metal wiring m2. Besides, the wiring resistance of each of the metal wirings m0a, m0, m1 and m2 is sufficiently smaller than the resistance value of the resistor layer 25.

In the resistor layer 25 of the embodiment, a region of the resistor design value Rr (hereinafter referred to as resistor Rr region) is arranged closer to the outer side than a region of the resistor design value R0 (hereinafter referred to as resistor R0 region). Then, the metal wiring m0a and the contact cn0a are arranged at the outermost boundary of the resistor Rr region. On the other hand, the metal wiring m0 and the contact cn0 are arranged at the boundary part between the resistor R0 region and the resistor Rr region.

In addition, as shown in FIG. 4A, the metal wiring m0 is connected to the inversion input end of the gamma amplifier 21-1, and the voltage Vgs0 output from the metal wiring m0 is fed back to the gamma amplifier 21-1. The gamma amplifier 21-1, the contact cn0a, the metal wiring m0a, the metal wiring m0, and the resistor Rr region between the voltage supply point and the voltage output point of the resistor layer 25 constitute a feedback circuit 26 (the circuit block surrounded by dashed lines shown in FIG. 4A). Besides, here the inversion input end of the gamma amplifier 21-1 is also a capacitive load, and thus no steady current flows through the contact cn0 and the metal wiring m0. Accordingly, the voltage Vgs0 on the resistor layer 25 can be directly taken out from the metal wiring m0.

Figure 5:
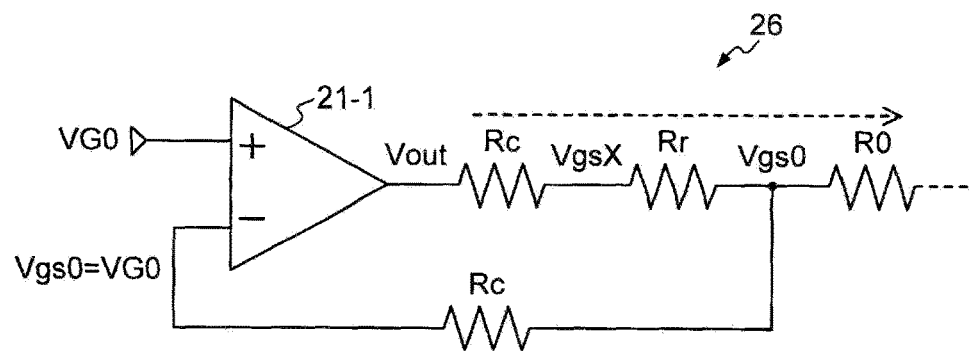
FIG. 5 is an equivalent circuit of a feedback circuit formed at an end of the level voltage generation circuit.

FIG. 5 is a circuit diagram showing the configuration of the feedback circuit 26 as an equivalent circuit including a contact resistance. The feedback circuit 26 is configured by the gamma amplifier 21-1, the resistors Rr and R0 in the resistor region of the resistor layer 25, and the resistors Rc of the contacts cn0 and cn0a. Between the voltage output end (Vout) of the gamma amplifier 21-1 and the voltage output point (Vgs0) of the resistor layer 25, the resistor Rc of the contact cn0a and the resistor Rr are connected via the voltage supply point (VgsX). In addition, the resistor Rc of the contact cn0 is connected between the inversion input end of the gamma amplifier 21-1 and the voltage output point (Vgs0) of the resistor layer 25. In addition, the inversion input end of the gamma amplifier 21-1 is also connected to the metal wiring m0 which is the output end of the level voltage generation circuit A1. The dashed arrow in the diagram of FIG. 5 schematically shows the direction of a steady current flowing from the output end of the gamma amplifier 21-1 to the resistor layer 25.

Next, the operation of the level voltage generation circuit A1 of this embodiment is described.

As shown in FIG. 4A, the gamma reference voltage VG0 and the voltage Vgs0 which is the output voltage from the metal wiring m0 are differentially input to the gamma amplifier 21-1. In addition, the output voltage Vout is output from the voltage output end of the gamma amplifier 21-1 and is supplied to the metal wiring m0a.

The gamma amplifier 21-2 (see FIG. 3) is connected to an end (not shown) of the resistor layer 25 opposite to the end to which the gamma amplifier 21-1 is connected. A steady current corresponding to the voltage difference between the gamma reference voltages VG0 and VG5 and the total resistance value of the resistor layer 25 flows through the resistor layer 25.

The current flowing through the resistor layer 25 also flows through the metal wiring m0a and the contact cn0a. When the resistance value of the metal wiring m0a is sufficiently small and can be ignored, a voltage difference Vc caused by the resistor Rc of the contact cn0a is generated between the output voltage Vout of the gamma amplifier 21-1 supplied to the metal wiring m0a and the voltage VgsX on the resistor layer 25. In addition, a voltage difference Vr caused by the resistor Rr of the resistor layer 25 is generated between the voltage VgsX and the voltage Vout.

The voltage Vgs0 taken out from the metal wiring m0 is fed back to the differential input of the gamma amplifier 21-1, and thus an imaginary short circuit state is reached and the voltage Vgs0 is equal to the gamma reference voltage VG0. Thereby, the gamma reference voltage VG0 (=Vgs0) is output from the level voltage generation circuit A1 regardless of the resistance value of the resistor Rc of the contact cn0, and the voltage Vgs0 at the voltage output point of the boundary between the resistors R0 and Rr of the resistor layer 25 is also equal to the gamma reference voltage VG0. On the other hand, because no steady current flows through the metal wirings m0, m1 and m2 and the contacts cn0, cn1 and cn2, the voltages Vgs0, Vgs1 and Vgs2 on the resistor layer are taken out from the metal wirings m0, m1 and m2.

Accordingly, the level voltage generation circuit A1 can highly precisely take out the voltage corresponding to the design resistance value of the resistor layer 25 with respect to the gamma reference voltage VG0 without being affected by the contact resistance. Besides, the output voltage Vout of the gamma amplifier 21-1 becomes Vout=Vgs0+Vr+Vc=VG0+Vr+Vc.

Besides, a circuit block having a similar configuration is also arranged at the opposite end of the resistor layer 25 (that is, the end to which the gamma amplifier 21-2 shown in FIG. 3 is connected), and the voltage Vgs(q−1) corresponding to the gamma reference voltage VG5 is output.

Figure 6A:
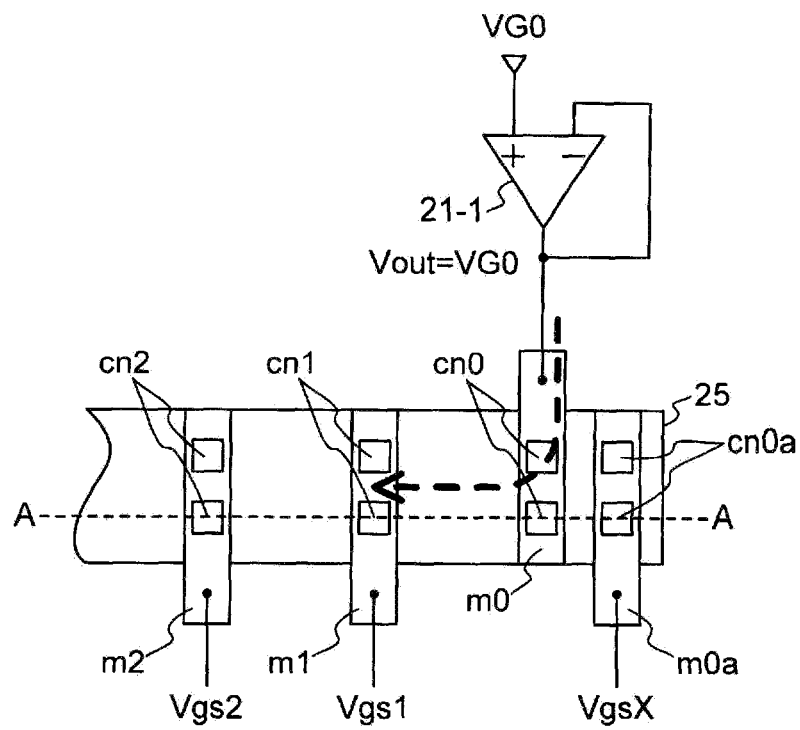
FIG. 6A is a plan view schematically showing the configuration of a level voltage generation circuit of a comparative example.
Figure 6B:
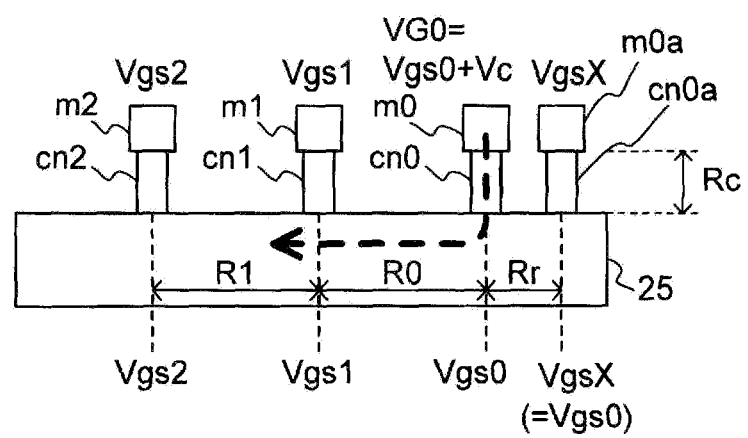
FIG. 6B is a cross-sectional view taken along line A-A of the level voltage generation circuit in FIG. 6A.

FIG. 6A is a diagram showing a circuit block including the gamma amplifier 21-1 having a configuration in which the output voltage Vout is fed back to the inversion input terminal, as a level voltage generation circuit of a comparative example which is different from the level voltage generation circuit A1 of the embodiment. FIG. 6B is a cross-sectional view taken along line A-A of FIG. 6A. Similar to FIG. 4B, in FIG. 6B, the contacts cn0a, cn0, cn1 and cn2 on the resistor layer 25 are set to divide the resistor layer 25 into the resistor regions Rr, R0 and R1, and the voltages at the boundary of the resistor regions are set as VgsX, Vgs0, Vgs1 and Vgs2. Besides, the description of the circuit diagram of the gamma amplifier 21-1 is also omitted in FIG. 6B.

In the level voltage generation circuit of the comparative example, the output voltage Vout of the gamma amplifier 21-1 is supplied to the metal wiring m0. The voltages VgsX, Vgs1 and Vgs2 are output from the metal wirings m0a, m1 and m2. Because no steady current flows from each voltage output point of the resistor layer 25, the metal wirings m0a, m1 and m2 can directly take out the voltage at each voltage output point on the resistor layer 25. In addition, because no steady current flows through the resistor Rr, Vgs0=VgsX is satisfied, and the voltage Vgs0 can be taken out from the metal wiring m0a. The reason is that the voltage supply point (Vgs0) and the voltage output point (VgsX) are separated.

However, in the level voltage generation circuit of the comparative example, the output voltage Vout (=VG0) is applied to the metal wiring m0, and a steady current flows to R0 and R1 of the resistor layer 25 via the contact cn0. Therefore, the voltage difference Vc of the resistor Rc of the contact cn0 is generated between the voltage Vgs0 and the output voltage VG0. That is, Vout=VG0=Vgs0+Vc is satisfied. Accordingly, the voltage design value obtained by dividing the gamma reference voltage VG0 with a resistance ratio has an absolute error corresponding to the voltage difference of the contact resistance Rc. Because this error is caused by the resistor Rc of the contact cn0, when the value of the contact resistance Rc varies between different data driver ICs, the gradation voltage signal also varies between the data driver ICs, which causes display unevenness.

On the contrary, according to the level voltage generation circuit A1 of the embodiment, it is possible to remove, from the output voltage of the first resistor ladder 22, the influence of the variation in resistance of the contact part connecting the resistor layer 25 and each metal wiring. Accordingly, it is possible to generate a highly precise output voltage (level voltage) of the resistor ladder in which the relative error between the output voltages and the absolute error from the design value are sufficiently small.

In addition, in the configuration of the level voltage generation circuit A1 of the embodiment, the current flowing through the resistor layer 25 flows in from the voltage supply point (VgsX) outside a voltage output point group arranged at the connection part between the resistor layer 25 and each of the metal wirings m0 to m2. Therefore, a current flows with a uniform current density at each voltage output point on the resistor layer 25. Accordingly, because the voltage is output from the uniform current density region, a highly precise voltage can be taken out from each voltage output point.

Besides, the output voltage Vout of the gamma amplifier 21-1 of the embodiment becomes a voltage obtained by adding, to the voltage Vgs0 (=VG0), the voltage difference Vr generated by the resistor Rr of the resistance value Rr region of the resistor layer 25 and the voltage difference Vc generated by the resistor Rc of the contact cn0a (that is, VG0+Vr+Vc). The setting range of the gamma reference voltage VG0 is narrower than the range of the power supply voltage by a voltage difference (Vr+Vc).

As described above, according to the level voltage generation circuit A1 of the embodiment, highly precise level voltages in which the relative error between the output voltages and the absolute error from the design value are sufficiently small can be output without being affected by the variation in contact resistance.

Embodiment 2

Next, Embodiment 2 of the disclosure is described. The display apparatus of this embodiment is different from that of Embodiment 1 in the configuration of the level voltage generation circuit A1.

Figure 7A:
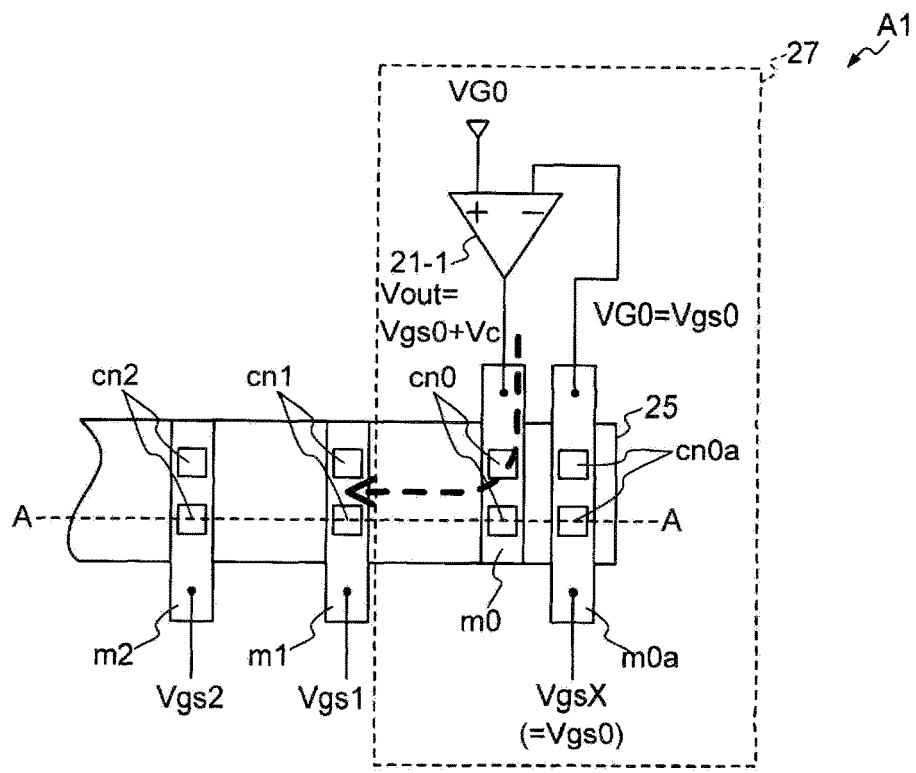
FIG. 7A is a plan view schematically showing the configuration of a level voltage generation circuit of Embodiment 2.
Figure 7B:
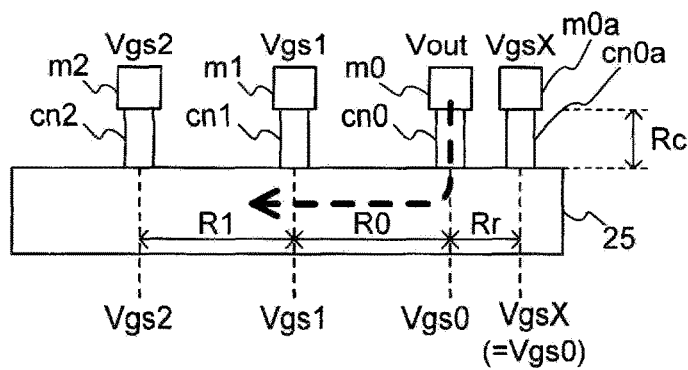
FIG. 7B is a cross-sectional view taken along line A-A of the level voltage generation circuit in FIG. 7A.

FIG. 7A is a schematic diagram showing the configuration of the level voltage generation circuit A1 of this embodiment. Similar to FIG. 4A of Embodiment 1, here a plan view in which a part of the resistor layer 25 constituting the first resistor ladder 22 is viewed from above is shown together with a circuit diagram of the gamma amplifier 21-1. In addition, FIG. 7B is a cross-sectional view taken along line A-A of FIG. 7A. Similar to FIG. 4A, the contacts cn0a, cn0, cn1 and cn2 on the resistor layer 25 are set to divide the resistor layer 25 into the resistor regions Rr, R0 and R1, and the voltages at the boundary of the resistor regions are set as VgsX, Vgs0, Vgs1 and Vgs2. Besides, the description of the circuit diagram of the gamma amplifier 21-1 is omitted in FIG. 7B.

The level voltage generation circuit A1 of this embodiment is different from the level voltage generation circuit A1 of Embodiment 1 in the connection relationship between the metal wirings m0a and m0 and the gamma amplifier 21-1. Specifically, in the level voltage generation circuit A1 of this embodiment, the metal wiring m0a is connected to the inversion input end of the gamma amplifier 21-1, and the metal wiring m0 is connected to the voltage output end of the gamma amplifier 21-1. That is, compared with the level voltage generation circuit A1 of Embodiment 1, the position of the voltage Vgs0 of the resistor layer 25 is the voltage supply point, and the position of the voltage VgsX is the voltage output point.

The output voltage Vout of the gamma amplifier 21-1 is supplied to the voltage supply point (Vgs0) located at the boundary between the resistor Rr region and the resistor R0 region of the resistor layer 25 via the metal wiring m0 and the contact cn0. In addition, the voltage is taken out from the voltage output point (VgsX) located at the outermost boundary of the resistor Rr region of the resistor layer 25 to which the contact cn0a is connected. At this time, no steady current flows through the resistor Rr of the resistor layer 25, the contact cn0a, and the metal wiring m0a. Accordingly, VgsX=Vgs0 is satisfied, and the voltage Vgs0 is output from the metal wiring m0a. Similarly, the voltages Vgs1 and Vgs2 at the voltage output points of the resistor layer 25 to which the contacts cn1 and cn2 are connected are respectively output from the metal wirings m1 and m2 through which no steady current flows.

In the level voltage generation circuit A1 of this embodiment, one of the voltage output points (VgsX) is disposed closer to the outer side than the voltage supply point (Vgs0) on the resistor layer 25. Besides, the voltage VgsX (=Vgs0) output from the metal wiring m0a is fed back to the gamma amplifier 21-1. The gamma amplifier 21-1, the contact cn0, the metal wiring m0, the metal wiring m0a, and the resistor Rr region of the resistor layer 25 constitute a feedback circuit 27 (the circuit block surrounded by dashed lines shown in FIG. 7A).

Figure 8:
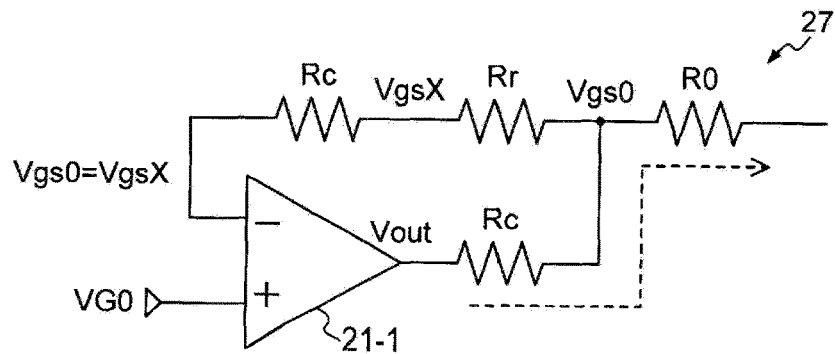
FIG. 8 is an equivalent circuit of a feedback circuit of Embodiment 2.

FIG. 8 is a circuit diagram showing the configuration of the feedback circuit 27 as an equivalent circuit including a contact resistance. The feedback circuit 27 includes the gamma amplifier 21-1, the resistors Rc of the contacts cn0 and cn0a, and the resistors Rr and R0 of the resistor layer 25. The resistor Rc of the contact cn0 is connected between the voltage output end (Vout) of the gamma amplifier 21-1 and the voltage supply point (Vgs0) of the resistor layer 25. In addition, between the inversion input end of the gamma amplifier 21-1 and the voltage supply point (Vgs0) of the resistor layer 25, the resistor Rc of the contact cn0a and the resistor Rr are connected via the voltage output point (VgsX). In addition, the inversion input end of the gamma amplifier 21-1 is also connected to the metal wiring m0a which is the output end of the level voltage generation circuit A1. The dashed arrow in the diagram of FIG. 8 schematically shows the direction of a steady current flowing from the output end of the gamma amplifier 21-1 to the resistor layer 25.

Next, the operation of the level voltage generation circuit A1 of this embodiment is described.

As shown in FIG. 7A, the gamma reference voltage VG0 and the voltage VgsX which is the output voltage from the metal wiring m0a are differentially input to the gamma amplifier 21-1. In addition, the output voltage Vout is output from the voltage output end of the gamma amplifier 21-1 and is supplied to the metal wiring m0.

Similar to Embodiment 1, a constant current corresponding to the voltage difference between the gamma reference voltages VG0 and VG5 and the total resistance value of the resistor layer 25 flows through the resistor layer 25. In addition, the steady current flowing through the resistor layer 25 also flows through the metal wiring m0 and the contact cn0. When the resistance value of the metal wiring m0 is sufficiently small and can be ignored, the voltage difference Vc caused by the contact cn0 is generated between the output voltage Vout of the gamma amplifier 21-1 supplied to the metal wiring m0 and the voltage Vgs0 on the resistor layer 25. On the other hand, no steady current flows through the metal wiring m0a and the contact cn0a, the metal wiring m1 and the contact cn1, and the metal wiring m2 and the contact cn2, and thus the voltages VgsX, Vgs1 and Vgs2 at the voltage output points on the resistor layer are taken out from the metal wirings m0a, m1 and m2. In addition, because no steady current flows through the resistor Rr of the resistor layer 25, the voltage VgsX at the voltage output point is equal to the voltage Vgs0 at the voltage supply point.

The voltage VgsX taken out from the metal wiring m0a is fed back to the differential input of the gamma amplifier 21-1, and thus an imaginary short circuit state is reached and the voltage VgsX is equal to the gamma reference voltage VG0. Because the voltage VgsX is equal to the voltage Vgs0, the voltage Vgs0 is also equal to the gamma reference voltage VG0. Thereby, from the level voltage generation circuit A1, the gamma reference voltage VG0 is output as the voltage Vgs0 at the voltage supply point of the resistor layer 25 regardless of the resistance value of the resistor Rc of the contact cn0.

Besides, if a circuit block of the level voltage generation circuit having a similar configuration is also arranged at the opposite end of the resistor layer 25 (that is, the end to which the gamma amplifier 21-2 shown in FIG. 3 is connected), the voltage Vgs(q−1) equal to the gamma reference voltage VG5 can be supplied to the resistor layer 25.

According to the level voltage generation circuit A1 of this embodiment, it is possible to remove, from the output voltage of the first resistor ladder 22, the influence of the variation in resistance of the contact part connecting the resistor layer 25 and each metal wiring. Accordingly, it is possible to generate a highly precise output voltage (level voltage) of the resistor ladder in which the relative error between the output voltages and the absolute error from the design value are sufficiently small.

Besides, in the configuration of the level voltage generation circuit A1 of this embodiment, because a steady current flows from the contact cn0 to the resistor layer 25 near the voltage supply point of the voltage Vgs0 on the resistor layer 25, the current density may become non-uniform compared with Embodiment 1 and the voltage precision may be slightly reduced. However, the output voltage Vout of the gamma amplifier 21-1 becomes a voltage obtained by adding the voltage difference Vc generated by the resistor Rc of the contact cn0a to the voltage Vgs0 (=VG0) (that is, VG0+Vc), and thus the setting range of the gamma reference voltage VG0 is narrower than the range of the power supply voltage by the voltage difference Vc and is wider than the setting range of the gamma reference voltage VG0 in Embodiment 1.

As described above, according to the level voltage generation circuit A1 of this embodiment, highly precise level voltages in which the relative error between the output voltages and the absolute error from the design value are sufficiently small can be output without being affected by the variation in contact resistance.

Embodiment 3

Next, Embodiment 3 of the disclosure is described. In the description of this embodiment, the output voltages of the second resistor ladder 24 (that is, the gamma reference voltages VG0 and VG5 and the voltages obtained by dividing each output voltage of the gamma amplifiers 21-3 to 21-6 by the second resistor ladder 24) are collectively referred to as "level voltages".

A level voltage generation circuit that generates a level voltage is formed at a connection part between each of the gamma amplifiers 21-3, 21-4, 21-5 and 21-6 and the second resistor ladder 24. In FIG. 3, the circuit block located at the connection part between the second resistor ladder 24 and the gamma amplifier 21-3 out of the level voltage generation circuit is shown as a level voltage generation circuit A2. Besides, a similar circuit block is also formed at the connection part between the second resistor ladder 23 and each of the gamma amplifiers 21-4, 21-5 and 21-6.

The level voltage generation circuit A2 includes the gamma amplifier 21-3 and a part of the second resistor ladder 24, and functions as a gradation voltage supply portion that supplies the voltage obtained by dividing the gamma voltages VG1 and VG2 (that is, the output voltages of the second resistor ladder 24) to the decoders 30-1 to 30-k.

Figure 9:
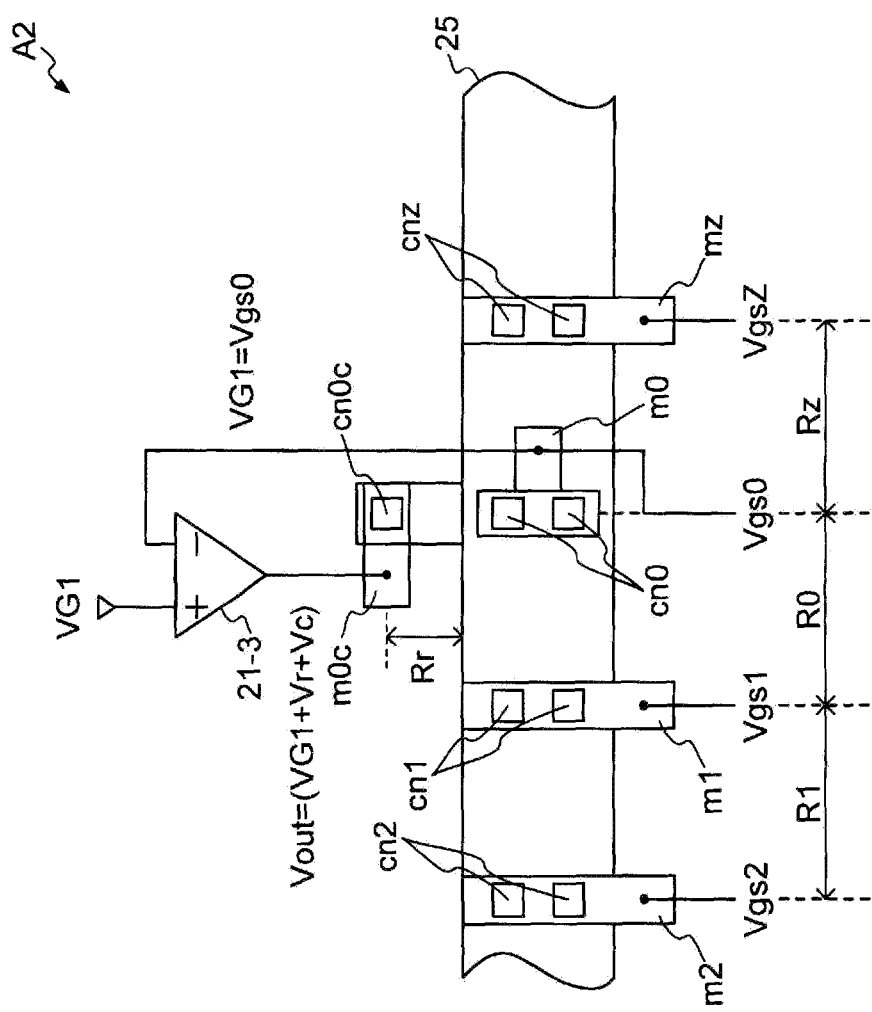
FIG. 9 is a plan view schematically showing the configuration of a level voltage generation circuit of Embodiment 3.

FIG. 9 is a schematic diagram showing the configuration of the level voltage generation circuit A2. The second resistor ladder 24 is formed using a thin film on a substrate (not shown) such as a semiconductor substrate or an insulating substrate. Here, a plan view in which a part of the resistor layer 25 constituting the second resistor ladder 24 is viewed from above is shown together with a circuit diagram of the gamma amplifier 21-3.

The level voltage generation circuit 22 is configured by the resistor layer 25 formed using a thin film on a substrate not shown, metal wirings mOc, m0, m1, m2 and mz including metal layers, and contacts cn0c, cn0, cn1, cn2 and cnz. The resistor layer 25 is divided into the regions of resistor design values Rz, R0 and R1 (hereinafter referred to as resistor Rz region, resistor R0 region, and resistor R1 region), and the metal wirings are connected via the contacts near the boundary of each region. Besides, the resistor of each of the metal wirings mz, m0, m1 and m2 is sufficiently smaller than the resistor value of the resistor layer 25.

Specifically, the metal wiring m0 is connected to the resistor layer 25 via the contact cn0 arranged at the boundary between the resistor Rz region and the resistor R0 region. The metal wiring m1 is connected to the resistor layer 25 via the contact cn1 arranged at the boundary between the resistor R0 region and the resistor R1 region. The metal wiring m2 is connected to the resistor layer 25 via the contact cn2 arranged at the boundary between the resistor R1 region and a resistor region (not shown) adjacent thereto. The metal wiring mz is connected to the resistor layer 25 via the contact cnz arranged at the boundary between the resistor Rz region and a resistor region (not shown) adjacent thereto.

In addition, at the boundary part between the resistor Rz region and the resistor R0 region of the resistor layer 25, a protrusion including the region of a design resistor Rr (hereinafter referred to as a resistor Rr region) is formed. The contact cn0c is arranged on the protrusion, and the metal wiring mOc is connected to the resistor layer 25 via the contact cn0c. The metal wiring mOc and the metal wiring m0 are separated in the same layer.

The contacts cnz, cn0, cn1 and cn2 on the resistor layer 25 are set to divide the resistor layer 25 into resistor regions Rz, R0 and R1, and the voltages at the boundaries of the resistor regions are set as Vgsz, Vgs0, Vgs1 and Vgs2.

The protrusion above the boundary of the resistors Rz and R0 to which the contact cn0c on the resistor layer 25 is connected is a voltage supply point of the resistor layer 25, and the output voltage Vout of the gamma amplifier 21-3 is supplied to the resistor layer 25 via the metal wiring mOc and the contact cn0c. Each of the boundary points of the resistor regions to which the contacts cnz, cn0, cn1 and cn2 on the resistor layer 25 are connected is a voltage output point at which the voltage obtained by dividing the voltage of the second resistor ladder 24 is output. The voltage Vgs0, which is the output voltage of the second resistor ladder 24, is output via the contact cn0 and the metal wiring m0. That is, in the level voltage generation circuit A2 of this embodiment, the voltage supply point and the voltage output point are separated.

In addition, the metal wiring m0 is connected to the inversion input end of the gamma amplifier 21-3, and the voltage Vgs0 output from the metal wiring m0 is fed back to the gamma amplifier 21-3. The gamma amplifier 21-3, the contact cn0, the metal wiring mOc, the resistor Rr region of the resistor layer 25, and the metal wiring mOc constitute a feedback circuit.

In the level voltage generation circuit A2 of this embodiment, the voltage supply point of the gamma voltage VG1 and the voltage output point of the voltage Vgs0 in the resistor layer 25 are separated, and respectively arranged at the intermediate portion (for example, near the boundary points of the resistor Rz region and the resistor R0 region) of the resistor layer 25 in the level voltage generation circuit A2. In addition, the voltage supply point of the gamma voltage VG1 of the resistor layer 25 is arranged at the outside of the path of the steady current flowing through the resistor Rz region, the resistor R0 region, and the resistor R1 region (that is, at the above protrusion). In addition, the voltage output points of the voltages Vgsz, Vgs0, Vgs1 and Vgs2, which are the output voltages of the second resistor ladder 24, are arranged on the path of the steady current flowing through the resistor Rz region, the resistor R0 region, and the resistor R1 region.

Next, the operation of the level voltage generation circuit A2 of this embodiment is described.

As shown in FIG. 9, the gamma voltage VG1 and the output voltage from the metal wiring m0 are differentially input to the gamma amplifier 21-3. In addition, the output voltage Vout is output from the voltage output end of the gamma amplifier 21-3 and supplied to the metal wiring mOc.

At this time, a current corresponding to the voltage difference between the gamma reference voltages VG0 and VG5 supplied to both ends of the second resistor ladder 24 and the gamma voltage VG1 and the resistance value between the voltage supply points of the resistor layer 25 flows through the resistor layer 25. In addition, when the steady current flowing through the resistor Rz region and the steady current flowing through the resistor R0 region are different, a steady current also flows through the metal wiring mOc, the contact cn0c, and the resistor Rr region of the protrusion. Here, when the resistance value of the metal wiring mOc is sufficiently small and can be ignored, a voltage difference (Vc+Vr) caused by the resistor Rc of the contact cn0c and the resistor Rr of the protrusion is generated between the output voltage Vout of the gamma amplifier 21-3 supplied to the metal wiring mOc and the voltage Vgs0 on the resistor layer 25. On the other hand, because no steady current flows from the resistor layer 25 into the metal wirings mz, m0, m1 and m2 and the contacts cnz, cn0, cn1 and cn2, the voltages Vgsz, Vgs0, Vgs1 and Vgs2 on the resistor layer are directly taken out from the metal wirings mz, m0, m1 and m2.

The voltage Vgs0 taken out from the metal wiring m0 is fed back to the differential input of the gamma amplifier 21-3, and thus an imaginary short circuit state is reached and the voltage Vgs0 is equal to the gamma voltage VG1. Thereby, the level voltage generation circuit A2 can precisely take out the voltage corresponding to the design resistance value of the resistor layer 25 with respect to the gamma voltage VG1 regardless of the resistance values of the resistor Rr of the protrusion of the resistor layer 25 and the resistor Rc of the contact cn0c.

According to the level voltage generation circuit A2 of this embodiment, it is possible to remove, from the output voltage of the second resistor ladder 24, the influence of the variation in resistance of the contact part connecting the resistor layer 25 and each metal wiring. Accordingly, it is possible to generate a highly precise output voltage (level voltage) of the resistor ladder in which the relative error between the output voltages and the absolute error from the design value are sufficiently small.

Besides, the output voltage Vout of the gamma amplifier 21-3 becomes a voltage obtained by adding, to the voltage Vgs0 (=VG1), the voltage difference Vr generated by the resistor Rr region of the protrusion and the voltage difference Vc generated by the resistor Rc of the contact cn0 (that is, VG1+Vr+Vc).

As described above, according to the level voltage generation circuit A2 of this embodiment, highly precise level voltages in which the relative error between the output voltages and the absolute error from the design value are sufficiently small can be output without being affected by the variation in contact resistance.

Embodiment 4

Next, Embodiment 4 of the disclosure is described. The display apparatus of this embodiment is different from that of Embodiment 3 in the configuration of the level voltage generation circuit A2.

Figure 10:
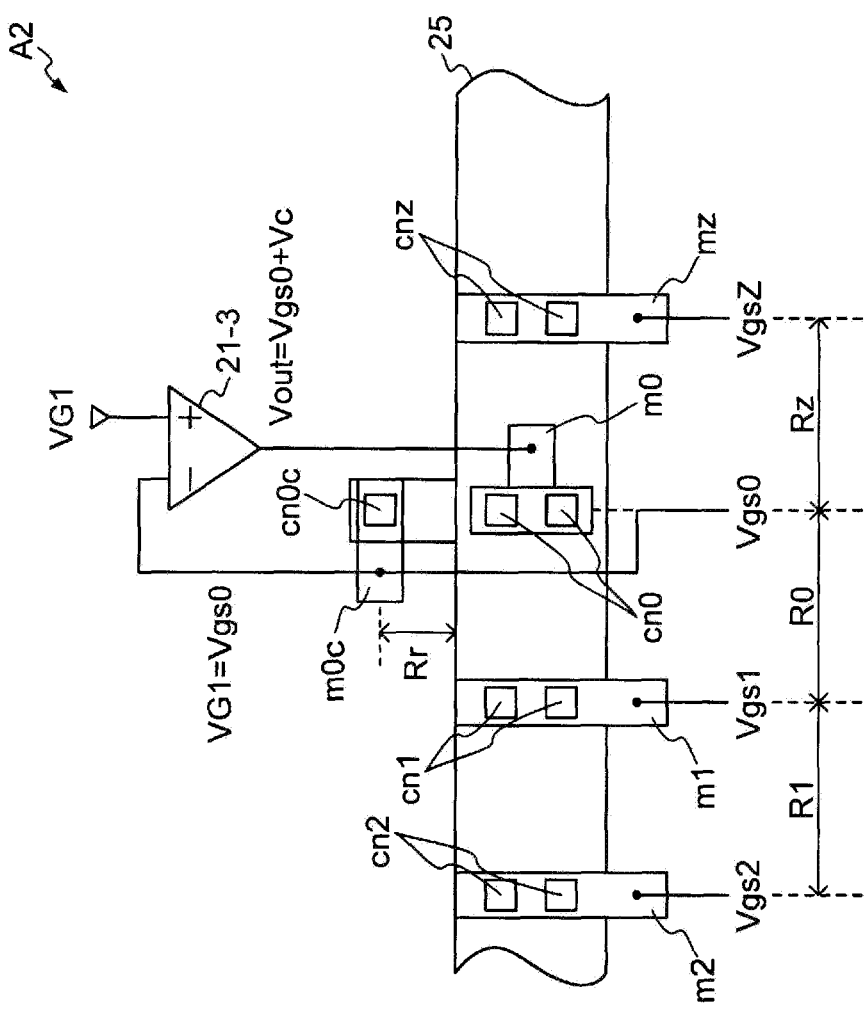
FIG. 10 is a plan view schematically showing the configuration of a level voltage generation circuit of Embodiment 4.
Figure 11A:
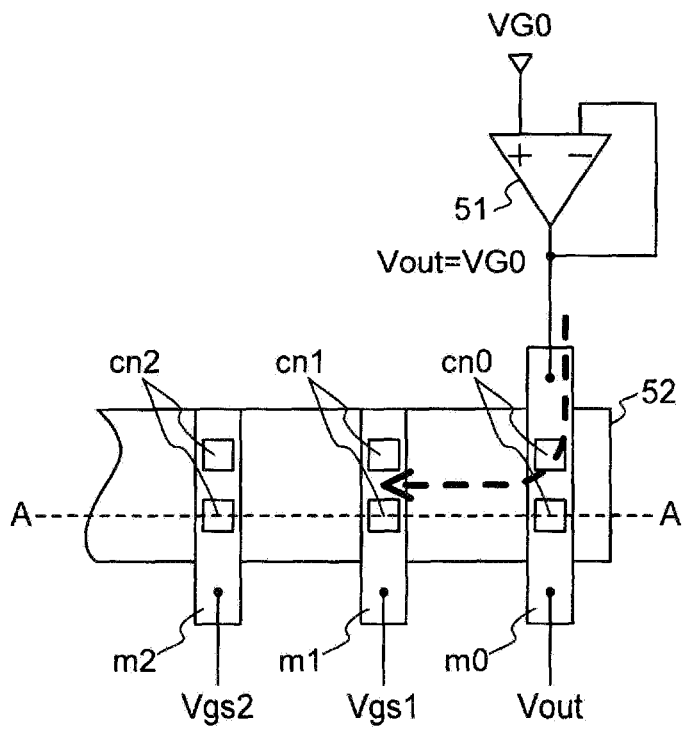
FIG. 11A is a plan view schematically showing the configuration of a level voltage generation circuit.
Figure 11B:
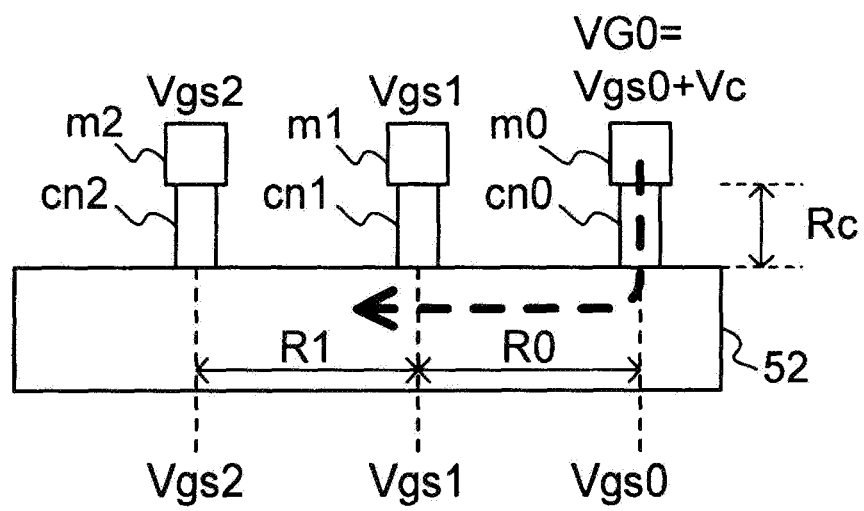
FIG. 11B is a cross-sectional view taken along line A-A of the level voltage generation circuit in FIG. 11A.

FIG. 10 is a schematic diagram showing the configuration of the level voltage generation circuit A2 of this embodiment. Here, a plan view in which a part of the resistor layer 25 constituting the second resistor ladder 24 is viewed from above is shown together with a circuit diagram of the gamma amplifier 21-3.

The level voltage generation circuit A2 of this embodiment is different from the level voltage generation circuit A2 of Embodiment 3 in the connection relationship between the metal wirings mOc and m0 and the gamma amplifier 21-3. Specifically, in the level voltage generation circuit A2 of this embodiment, the metal wiring mOc is connected to the inversion input end of the gamma amplifier 21-1, and the metal wiring m0 is connected to the voltage output end of the gamma amplifier 21-1. That is, compared with the level voltage generation circuit A2 of Embodiment 3, the position of the point at which the output voltage Vout of the gamma amplifier 21-3 is supplied to the resistor layer 25 and the position of the point at which the voltage is output from the resistor layer 25 are exchanged.

Similar to FIG. 9, the contacts cnz, cn0, cn1 and cn2 on the resistor layer 25 are set to divide the resistor layer 25 into the resistor regions Rz, R0 and R1, and the voltages at the boundaries of the resistor regions are set as Vgsz, Vgs0, Vgs1 and Vgs2. The output voltage Vout of the gamma amplifier 21-1 is supplied to the voltage supply point (Vgs0) located at the boundary between the resistor Rz region and the resistor R0 region of the resistor layer 25 via the metal wiring m0 and the contact cn0.

The voltage output point of the voltage Vgs1 is located at the boundary between the resistor R0 region and the resistor R1 region, and the metal wiring m1 is connected to the boundary via the contact cn1. The voltage output point of the voltage Vgs2 is located at the boundary between the resistor R1 region and the resistor region (not shown) adjacent thereto, and the metal wiring m2 is connected via the contact cn2. The voltage output point of the voltage Vgsz is located at the boundary between the resistor Rz region and the resistor region (not shown) adjacent thereto, and the metal wiring mz is connected via the contact cnz.

In addition, at the boundary part between the resistor Rz region and the resistor R0 region of the resistor layer 25, a protrusion including the resistor Rr region is formed. The contact cn0c is arranged on the protrusion, and the metal wiring mOc is connected to the resistor layer 25 via the contact cnc. The metal wiring mOc and the metal wiring m0 are separated in the same layer.

The voltage Vgsz is output from the metal wiring mz, the voltage Vgs1 is output from the metal wiring m1, and the voltage Vgs2 is output from the metal wiring m2. Besides, the resistance of each of the metal wirings mz, m0, m1 and m2 is sufficiently smaller than the resistance value of the resistor layer 25.

The output voltage Vout of the gamma amplifier 21-3 is supplied to the voltage supply point (Vgs0) of the resistor layer 25 via the metal wiring m0 and the contact cn0. Each of the boundary points of the resistor regions to which the contacts cnz, cn0c, cn1 and cn2 on the resistor layer 25 are connected is a voltage output point at which the voltage obtained by dividing the voltage of the second resistor ladder 24 is output. The voltage of the protrusion of the resistor layer 25, which is the output voltage of the second resistor ladder 24, is output via the contact cn0c and the metal wiring mOc. That is, in the level voltage generation circuit A2 of this embodiment, the voltage supply point and the voltage output point are separated.

In addition, the metal wiring mOc is connected to the inversion input end of the gamma amplifier 21-3, and the voltage output from the metal wiring mOc is fed back to the gamma amplifier 21-3. The gamma amplifier 21-3, the metal wiring m0, the contact cn0, the resistor Rr region of the resistor layer 25, and the metal wiring mOc constitute a feedback circuit.

Next, the operation of the level voltage generation circuit A2 of this embodiment is described.

As shown in FIG. 10, the gamma voltage VG1 and the output voltage from the metal wiring mOc are differentially input to the gamma amplifier 21-3. In addition, the output voltage Vout is output from the voltage output end of the gamma amplifier 21-3 and supplied to the metal wiring m0.

At this time, a steady current corresponding to the voltage difference between the gamma reference voltages VG0 and VG5 supplied to both ends of the second resistor ladder 24 and the gamma voltage VG1 and the resistance value between the voltage supply points of the resistor layer 25 flows through the resistor layer 25. In addition, when the steady current flowing through the resistor Rz region and the steady current flowing through the resistor R0 region are different, a current also flows through the metal wiring m0 and the contact cn0. Here, when the resistance value of the metal wiring m0 is sufficiently small and can be ignored, the voltage difference Vc caused by the resistor Rc of the contact cn0 is generated between the output voltage Vout of the gamma amplifier 21-3 supplied to the metal wiring m0 and the voltage Vgs0 on the resistor layer 25. On the other hand, because no steady current flows through the metal wirings mz, m0c, m1 and m2, the contacts cnz, cn0c, cn1 and cn2, and the resistor region Rr of the protrusion, the voltage at the connection point between the protrusion of the resistor layer 25 and the contact cn0c is equal to the voltageVgs0, and the voltages Vgsz, Vgs0, Vgs1 and Vgs2 on the resistor layer are directly taken out from the metal wirings mz, m0c, m1 and m2.

The voltage Vgs0 taken out from the metal wiring mOc is fed back to the differential input of the gamma amplifier 21-3, and thus an imaginary short state is reached and the voltage Vgs0 is equal to the gamma voltage VG1. Thereby, the level voltage generation circuit A2 can precisely take out the voltage corresponding to the design resistance value of the resistor layer 25 with respect to the gamma voltage VG1 regardless of the resistance values of the resistor Rr of the protrusion of the resistor layer 25 and the resistances Rc of the contacts cn0 and cn0c.

Besides, the output voltage Vout of the gamma amplifier 21-3 becomes a voltage obtained by adding, to the voltage Vgs0 (=VG1), the voltage difference Vc generated by the resistance Rc of the contact cn0 (that is, VG1+Vc).

As described above, according to the level voltage generation circuit A2 of this embodiment, it is possible to remove the influence of the resistance variation of the contact part connecting the resistor layer 25 and each metal wiring from the output voltage of the second resistor ladder 24, and thereby output highly precise level voltages (the output voltage of the resistor ladder) in which the relative error between the output voltages and the absolute error from the design value are sufficiently small.

Besides, the disclosure is not limited to the above embodiment. For example, in Embodiments 1 and 2, the example has been described in which the circuit block as shown in FIG. 4A or 4B (that is, the voltage generation circuit A1) is formed at the connection part between each of the gamma amplifiers 21-1 and 21-2 and the first resistor ladder 22. However, different from this embodiment, a circuit block having a similar configuration may be formed at the connection part between each of the gamma amplifiers 21-1 and 21-2 and the second resistor ladder 24. That is, in the level voltage generation circuit having the circuit block configured as in Embodiments 1 and 2, the circuit block as described above may be formed between the first resistor ladder 22 and each of the gamma amplifiers 21-1 and 21-2 or between the second resistor ladder 24 and each of the gamma amplifiers 21-1 and 21-2.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A level voltage generation circuit, which generates, based on N (N is an integer greater than or equal to 2) different input voltages, M (M is an integer greater than N) level voltages, the level voltage generation circuit comprising:

N differential amplifiers having output ends, which receive the N input voltages respectively, amplify the N input voltages respectively and output amplified N input voltages, and a resistor ladder having N voltage supply points respectively connected to the output ends of the N differential amplifiers and M voltage output points for outputting the M level voltages;

wherein the M voltage output points are connected to capacitive loads on input sides of load amplifiers, and at least one of the N differential amplifiers has an input pair and an output end connected to one of the N voltage supply points, one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

2. The level voltage generation circuit according to claim 1, wherein each of the N voltage supply points and the M voltage output points set on the resistor ladder is connected to a metal wiring via a contact having conductivity, each output end of the N differential amplifiers is connected to each of the metal wirings connected to the N voltage supply points, each of the level voltages output from the M voltage output points is output from each of the metal wirings connected to the M voltage output points, and one contact and one metal wiring to which the one voltage supply point is connected and another contact and another metal wiring to which the one voltage output point is connected, which are other than the the resistor ladder between the one voltage supply point and the one voltage output point, are insulated from each other.

3. The level voltage generation circuit according to claim 1, wherein the resistor ladder is configured as one resistor, and the resistor has a plurality of resistor regions that is adjacent to each other with positions corresponding to the M voltage output points as boundaries, and the resistor is configured so that a drive current corresponding to the N input voltages and a resistance value of the resistor flows in one direction from one region toward the other region located at both ends among the plurality of resistor regions.

4. The level voltage generation circuit according to claim 3, wherein the one voltage supply point is arranged in a first resistor region located at one end of the resistor ladder among the plurality of resistor regions, and the one voltage output point is arranged in a second resistor region adjacent to the first resistor region.

5. The level voltage generation circuit according to claim 3, wherein the one voltage output point is arranged in a first resistor region located at one end of the resistor ladder among the plurality of resistor regions, and the one voltage supply point is arranged in a second resistor region adjacent to the first resistor region.

6. The level voltage generation circuit according to claim 3, wherein the resistor ladder has a protrusion that is connected to a boundary part of a pair of resistor regions that are adjacent and located outside the end of the resistor ladder among the plurality of resistor regions, and that is arranged on an outer side of a current path of the drive current, the one voltage supply point is arranged on the protrusion, and the one voltage output point is arranged at the boundary part of the pair of resistor regions located on the current path of the drive current.

7. The level voltage generation circuit according to claim 3, wherein the resistor ladder has a protrusion that is connected to a boundary part of a pair of resistor regions that are adjacent and located outside the end of the resistor ladder among the plurality of resistor regions, and that is arranged on an outer side of a current path of the drive current,
the one voltage output point is arranged on the protrusion, and
the one voltage supply point is arranged at the boundary part of the pair of resistor regions located on the current path of the drive current.

8. A data driver, which is connected to a display panel having a plurality of data lines and supplies gradation voltage signals corresponding to video data signals to the plurality of data lines, the data driver comprising:
a gamma voltage generation circuit that amplifies N (N is an integer greater than or equal to 2) different reference voltages supplied to the data driver and generates M (M is an integer greater than N) gamma voltages obtained by dividing the amplified N reference voltages; and
a gradation voltage output portion that generates the gradation voltage signals corresponding to the video data signals based on the M gamma voltages output from the gamma voltage generation circuit;
wherein the gamma voltage generation circuit comprises:
N differential amplifiers having output ends, which receive the N reference voltages respectively, amplify the N reference voltages respectively and output the amplified the N reference voltages, and
a resistor ladder having N voltage supply points connected respectively to the output ends of the N differential amplifiers and M voltage output points for outputting the M gamma voltages;
the M voltage output points are connected to capacitive loads on input sides of the amplifiers having the gradation voltage output portion, and
at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

9. A data driver, which is connected to a display panel having a plurality of data lines and supplies gradation voltage signals corresponding to video data signals to the plurality of data lines, the data driver comprising:
a gamma voltage generation portion that generates N (N is an integer greater than or equal to 2) different gamma voltages, and
a gradation voltage generation circuit that amplify the N gamma voltages and generates M (M is an integer greater than N) gradation voltages obtained by dividing the amplified N gamma voltages, and outputs the gradation voltages corresponding to the video data signals to an amplifier arranged for each output of the data driver;
wherein the gradation voltage generation circuit comprises:
N differential amplifiers having output ends, which receive the N gamma voltages respectively, amplify the N gamma voltages respectively and output the amplified N gamma voltages, and
a resistor ladder having N voltage supply points connected respectively to the output ends of the N differential amplifiers and M voltage output points for outputting the M gradation voltages;
the M voltage output points are connected to capacitive loads on input sides of the amplifiers, and
at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

10. A display apparatus, comprising:
a display panel having a plurality of data lines, a plurality of scanning lines, and pixel switches and pixel portions arranged at respective intersection portions of the plurality of data lines and the plurality of scanning lines;
a gate driver that supplies scanning signals for controlling the pixel switches to be turned on to the plurality of scanning lines in a selection duration corresponding to a pulse width; and
a data driver that supplies gradation voltage signals corresponding to video data signals to the plurality of data lines;
wherein the data driver comprises:
a gamma voltage generation circuit that amplify N (N is an integer greater than or equal to 2) different reference voltages supplied to the data driver and generates M (M is an integer greater than N) gamma voltages obtained by dividing the amplified N reference voltages; and
a gradation voltage output portion that generates the gradation voltage signals corresponding to the video data signals based on the M gamma voltages output from the gamma voltage generation circuit;
the gamma voltage generation circuit comprises:
N differential amplifiers having output ends, which receive the N reference voltages respectively, amplify the N reference voltages respectively and output the amplified N reference voltages, and
a resistor ladder having N voltage supply points connected to the output ends of the N differential amplifiers and M voltage output points for outputting the M gamma voltages;
the M voltage output points are connected to capacitive loads on input sides of the amplifiers having the gradation voltage output portion, and
at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

11. A display apparatus, comprising:
a display panel having a plurality of data lines, a plurality of scanning lines, and pixel switches and pixel portions arranged at respective intersection portions of the plurality of data lines and the plurality of scanning lines;
a gate driver that supplies scanning signals for controlling the pixel switches to be turned on to the plurality of scanning lines in a selection duration corresponding to a pulse width; and
a data driver that supplies gradation voltage signals corresponding to video data signals to the plurality of data lines;
wherein the data driver comprises:

a gamma voltage generation portion that generates N (N is an integer greater than or equal to 2) different gamma voltages, and a gradation voltage generation circuit that amplifies the N gamma voltages, generates M (M is an integer greater than N) gradation voltages obtained by dividing the amplified N gamma voltages, and outputs the gradation voltages corresponding to the video data signals to an amplifier arranged for each output of the data driver;

the gradation voltage generation circuit comprises:

N differential amplifiers having output ends, which receive the N gamma voltages respectively, amplify the N gamma voltages and output the amplified N gamma voltages, and a resistor ladder having N voltage supply points connected to the output ends of the N differential amplifiers and M voltage output points for outputting the M gradation voltages;

the M voltage output points are connected to capacitive loads on input sides of the amplifiers, and at least one of the N differential amplifiers has an input pair and an output end connected to one of the N voltage supply points; one of the N input voltages is received by one of the input pair, the other one of the input pair is connected to one of the M voltage output points for outputting a level voltage closest to a voltage at the one voltage supply point, and the one voltage supply point and the one voltage output point are set at different positions on the resistor ladder.

* * * * *